United States Patent
Flamm

(10) Patent No.: US 8,179,158 B2
(45) Date of Patent: May 15, 2012

(54) PRINTED CIRCUIT BOARD HAVING A TERMINATION OF A T-SHAPED SIGNAL LINE

(75) Inventor: Peter Flamm, Breisach (DE)

(73) Assignee: Micronas GmbH, Freiburg (DE)

( * ) Notice: Subject to any disclaimer, the term of this patent is extended or adjusted under 35 U.S.C. 154(b) by 0 days.

(21) Appl. No.: 12/552,017

(22) Filed: Sep. 1, 2009

(65) Prior Publication Data

US 2010/0060318 A1 Mar. 11, 2010

(30) Foreign Application Priority Data

Sep. 4, 2008 (DE) .......................... 10 2008 045 707

(51) Int. Cl.
*H03K 17/16* (2006.01)
*H03K 19/003* (2006.01)

(52) U.S. Cl. ............ 326/30; 326/86; 327/109; 327/379; 333/33

(58) Field of Classification Search .................... 326/21, 326/33, 82, 86, 90, 30–31; 327/108–109, 327/379, 21, 30, 31, 33, 82, 86; 333/22 R, 333/32–33, 22

See application file for complete search history.

(56) References Cited

U.S. PATENT DOCUMENTS

| | | | | |
|---|---|---|---|---|
| 5,781,028 A * | 7/1998 | Decuir | ............................ | 326/30 |
| 6,493,394 B2 * | 12/2002 | Tamura et al. | ................. | 375/257 |
| 6,560,290 B2 * | 5/2003 | Ahn et al. | ...................... | 375/259 |
| 6,593,768 B1 * | 7/2003 | Iyer et al. | ........................ | 326/30 |
| 6,791,950 B2 * | 9/2004 | Wu | ................. | 370/257 |
| 7,161,378 B2 * | 1/2007 | Kang et al. | ...................... | 326/30 |
| 7,456,650 B2 * | 11/2008 | Lee | ................................. | 326/30 |
| 2003/0001610 A1 * | 1/2003 | Ramachandran et al. | ...... | 326/30 |
| 2003/0086501 A1 * | 5/2003 | Dreps et al. | .................... | 375/257 |
| 2005/0062554 A1 * | 3/2005 | Cogdill et al. | ............. | 333/22 R |

* cited by examiner

*Primary Examiner* — Jason M Crawford

(74) *Attorney, Agent, or Firm* — Muncy, Geissler, Olds & Lowe, PLLC

(57) ABSTRACT

Printed circuit board having a termination of a T-shaped signal line having at least two line ends, one line end being terminated using a terminating resistor against a supply voltage, and the other line end being terminated against the reference potential of the supply voltage.

10 Claims, 3 Drawing Sheets

REPLACEMENT SHEET

PRINTED CIRCUIT BOARD HAVING A TERMINATION OF A T-SHAPED SIGNAL LINE

PRIORITY INFORMATION

This patent application claims priority from German Patent Application No. 10 2008 045 707.7 filed Sep. 4, 2007, which is hereby incorporated by reference.

BACKGROUND OF THE INVENTION

The present invention relates to a printed circuit board having a termination of a T-shaped signal line.

Many electronic systems such as computer systems, control units, or control devices include a plurality of memory units such as read-write memories (RAMs) which are controlled by a plurality of integrated circuits (IC) such as microprocessors or controllers. The memory units and the integrated circuits are disposed on a printed circuit board and communicate with each other via signal lines also disposed on the printed circuit board.

Due to the increasingly high operating speeds of such integrated circuits, communications via the signal lines between these integrated circuits on the printed circuit board have increasingly higher data transfer rates.

In order to enable high-speed electric communications (i.e., signal transfer) at high frequencies and with steep edges, the signal lines on the printed circuit board must have a defined impedance to avoid signal reflections on the signal lines. Such signal reflections may be mitigated or eliminated by terminating the signal lines with the aid of terminating resistors. The signal lines may be terminated using serial termination (i.e., at the beginning of the signal line) or parallel termination (i.e., at the end of the signal line).

FIG. 1 illustrates a printed circuit board 10 having a known parallel termination of a T-shaped signal line 12 between (i) an output 14 of a driver 16 (e.g., an output driver) of a first integrated circuit 18, for example, of a control unit such as a microprocessor or controller and (ii) respective inputs 20, 22 of input drivers 24, 26 of second and third integrated circuits 28, 30, for example, of memory units such as read-write memories (RAM). In the case of RAMs, these inputs 20, 22 represent, for example, address inputs of dynamic random access memories (DRAMs) and are supplied from the output 45 driver 16 of the integrated circuit 18.

The T-shaped signal line 12 has a first track conductor 32, which branches off into parallel second and third track conductors 34, 36 whose line ends are respectively connected to the inputs 20, 22. The first track conductor 32 has, for example, an impedance of 46Ω. The second and the third track conductors 34, 36 each have, for example, an impedance of 64.2Ω. These track conductors 32, 34, 36, however, are not limited to having the impedances in the aforesaid example.

A terminating resistor 38, 40 is connected to a center voltage $U_M$ at each respective line end of the T-shaped signal line 12. The center voltage $U_M$ (e.g., 0.9V) is generated by a fourth integrated circuit 42 from a supply voltage (e.g., 1.8V) for the second and the third integrated circuits 28, 30. The fourth integrated circuit 42 stabilizes the voltage even at high currents, and works both as a current source and as a current sink. The impedances of terminating resistors 38, 40 (e.g., 75Ω) are a function of the line impedance.

Disadvantageously, the fourth integrated circuit 42 adds a high degree of complexity to the termination in the partial circuit board of FIG. 1, which requires additional space on the printed circuit board, and increases manufacturing costs.

FIG. 2 illustrates a printed circuit board 100 having another known parallel termination, which is implemented without the fourth integrated circuit 42 from the circuit in FIG. 1 for generating termination voltage $U_M$ of 0.9V.

According to FIG. 2, the termination voltage (e.g., 0.9V) is generated by a voltage divider from a supply voltage $U_B$ (e.g., 1.8V) for each of the second and the third integrated circuits 28, 30. For terminating the line end connected to the input 20, the voltage divider includes resistors 39, 44, each of which has an impedance twice that of the terminating resistors 38, 40 in FIG. 1. A corresponding voltage divider that includes resistors 41, 46 forms the termination of the line end connected to input 22, where each of the resistors 40, 46 has twice the impedance value of the terminating resistors 38, 40 in FIG. 1. The two voltage dividers 38/44 and 40/46 are disposed between the supply voltage UB and a reference potential, i.e., ground GND of the second and the third integrated circuits 28, 30.

Although termination according to FIG. 2 does not use the fourth integrated circuit 42 from the circuit 10 illustrated in FIG. 1, it does require twice as many resistors as compared to the termination in FIG. 1. Disadvantageously, these additional resistors require additional installation space and increase the associated cost.

SUMMARY OF THE INVENTION

An object of the present invention is to provide a simple and cost-effective termination for line ends of a T-shaped signal line for an output of an integrated circuit which drives inputs of two other integrated circuits using an output driver.

According to one aspect of the present invention, a printed circuit board is provided having a termination of a T-shaped signal line. The printed circuit board includes a first integrated circuit, at least one second and third integrated circuit, a line beginning of the T-shaped signal line, at least two line ends of the T-shaped signal line, and a first and a second terminating resistor. The first integrated circuit has at least one data output. The second and the third integrated circuits each have a data input and a power supply unit for generating a supply voltage against a reference potential for the second and the third integrated circuits. The line beginning of the T-shaped signal line is connected to the data output of the first integrated circuit. The line ends of the T-shaped signal line are each connected to a data input of the second and the third integrated circuits. The first and the second terminating resistor respectively terminate the line ends at the data inputs of the second and the third integrated circuits. The first terminating resistor is terminated against the supply voltage, and the second terminating resistor is terminated against the reference potential.

According to another aspect of the present invention, a printed circuit board is provided having a T-shaped signal line termination. The printed circuit board includes first, second and third integrated circuits, a T-shaped signal line, a power supply unit, a first terminating resistor and a second terminating resistor. The first integrated circuit has a data output. The second and the third integrated circuits each have a data input. The T-shaped signal line has first and second line ends, and connects, in parallel, the data inputs of the second and the third integrated circuits to the data output of the first integrated circuit. The power supply unit is adapted to generate a supply voltage against a reference potential. The first terminating resistor terminates the first line end of the T-shaped signal line against the supply voltage at the data input of the second integrated circuit. The second terminating resistor terminates the second line end of the T-shaped signal line against the reference potential at the data input of the third integrated circuit.

In contrast to known terminations, in one embodiment, this asymmetric termination of the T-shaped signal line does not require terminating resistors to terminate against a center voltage $U_M$ or a supply voltage $U_B$ of integrated circuits connected to the line ends as illustrated in FIGS. 1 and 2. Rather, the terminating resistors respectively terminate against the supply voltage $U_B$ at one line end and against the reference potential (e.g., a ground) of the supply voltage at the other line end.

Advantageously, using such a termination, the fourth integrated circuit required in the known termination illustrated in FIG. 1 for generating the center voltage $U_M$, and one-half of the terminating resistors required in the known termination illustrated in FIG. 2 are no longer necessary. As a result, a termination according to the present invention can save installation space on the printed circuit board, and thereby reduce associated manufacturing costs.

In another embodiment, a termination according to the present invention may also be used on T-shaped signal lines having more than two line ends; e.g., where the signal lines have 2n ($n \geq 1$, $n \in N$) line ends, which are each connected to inputs of additional integrated circuits. 2n/2 (i.e., half) of the line ends are terminated against the supply voltage, while the other 2n/2 of the line ends are terminated against the reference potential (e.g., the ground) of the supply voltage. The terminating resistors are preferably configured having substantially identical impedance values. The termination voltage is preferably 50% of the supply voltage of the integrated circuits connected to the line ends.

In another embodiment, the integrated circuits connected to the line ends of the T-shaped signal line include memory modules, in particular read-write memories (RAMs) having one input driver each. In a preferred embodiment, the input drivers representing address, control, and clock inputs of the RAMs.

These and other objects, features and advantages of the present invention will become more apparent in light of the following detailed description of preferred embodiments thereof, as illustrated in the accompanying drawings.

DETAILED DESCRIPTION OF THE INVENTION

Figure 1:
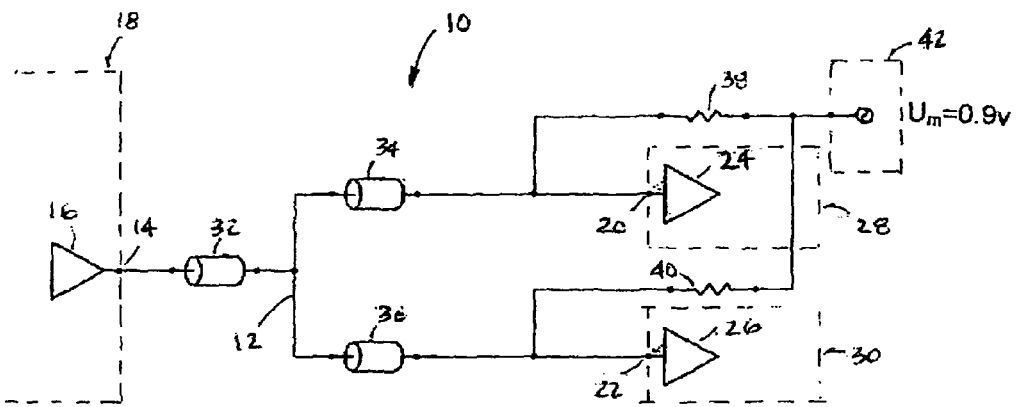
FIG. 1 illustrates a wiring diagram of a known termination for a T-shaped signal line having two line ends.
Figure 2:
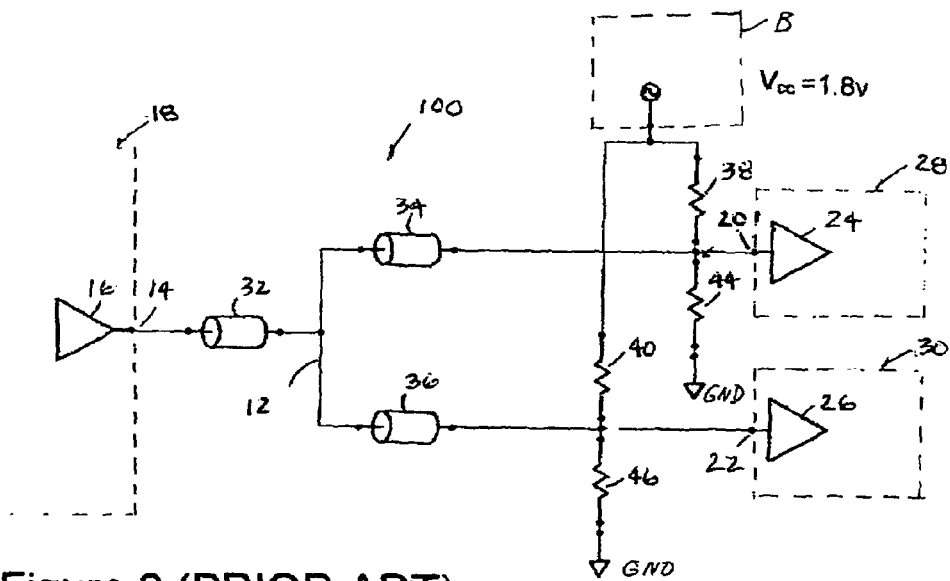
FIG. 2 illustrates a wiring diagram of another known termination for a T-shaped signal line having two line ends.

As set forth above, FIGS. 1 and 2 each illustrate a known termination of the T-shaped signal line 12 having two line ends. Each of the lines ends of the signal line 12 is respectively connected to the input 20, 22 of the input driver 24, 26 of the second and the third integrated circuits 28, 30. The output driver 16 of the first integrated circuit 18 respectively controls the two inputs 20, 22 of the second and the third integrated circuits 28, 30 via the T-shaped signal line 12. Notably, apart from the type of termination, these circuits are substantially identical to the exemplary embodiments of the present invention illustrated in FIGS. 3 and 4.

Figure 3:
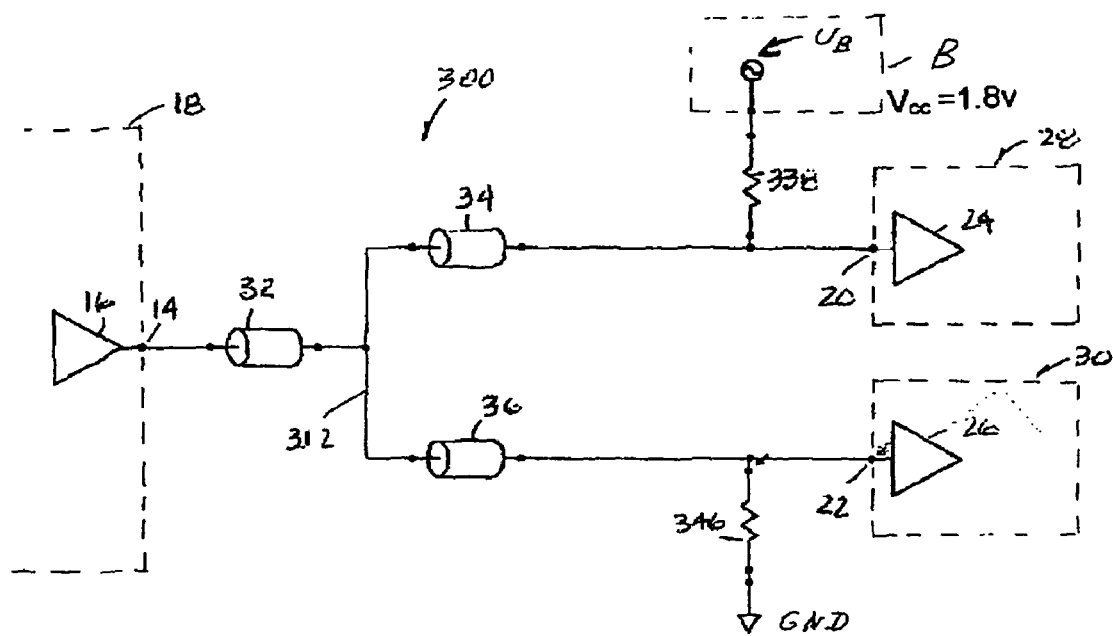
FIG. 3 illustrates a wiring diagram of a termination, according to one embodiment of the present invention, for a T-shaped signal line having two line ends.

According to one embodiment of a circuit 300 as illustrated in FIG. 3, a first terminating resistor 338 is connected to the supply voltage UB for terminating a line end of a T-shaped signal line 312. The signal line 312 is connected to the first input 20 of the second integrated circuit 28. A second terminating resistor 346 is connected to the reference potential GND of the supply voltage UB (i.e., a ground GND) for terminating the line end connected to the second input 22 of the third integrated circuit 30. A termination voltage (e.g., of 0.9V where the supply voltage UB is 1.8V) is generated by a voltage divider formed by the terminating resistors 338, 346 and the low-impedance line. The terminating resistors 338, 346 each have an impedance value (e.g., 75Ω) which is determined by the line impedance.

In the embodiment in FIG. 3, a power supply unit B and/or an external power source generates the supply voltage $U_B$.

In contrast to the circuits in FIGS. 1 and 2, the circuit 300 in FIG. 3 can omit the fourth integrated circuit 42 for generating the 0.9V center voltage and one-half of the terminating resistors (e.g., the terminating resistors 40, 44). These omissions save considerable installation space on the printed circuit board, and reduce manufacturing costs of the printed circuit board.

The termination according to the embodiment shown in FIG. 3 may be used with any printed circuit board having an integrated circuit which drives two inputs of other integrated circuits over a T-shaped structure of a signal line using an output driver, where the signal line ends are terminated according to the present invention. In a preferred embodiment, the "other" integrated circuits include read-write memories, in particular RAMs, having address, control, and clock inputs.

A termination according to the present invention may also be used for T-shaped signal lines having more than two line ends. For example, in the embodiment in FIG. 4, a T-shaped signal line 412 has 2n line ends for a defined $n \in N$, where $n > 1$.

Figure 4:
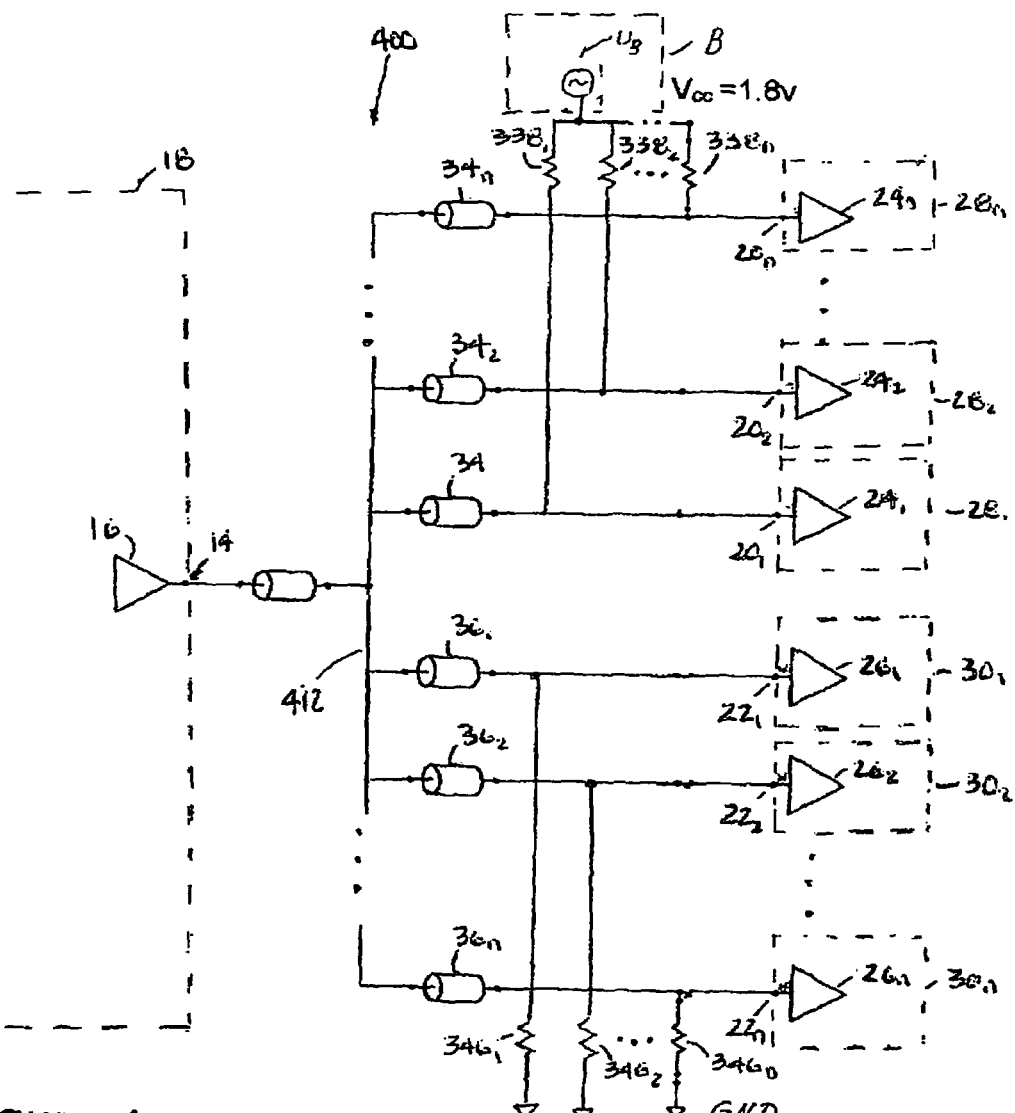
FIG. 4 illustrates a wiring diagram of a termination, according to another embodiment of the present invention, for a T-shaped signal line having more than two line ends.

Referring to FIG. 4, a circuit 400 includes the T-shaped signal line 412. The signal line 412 includes the track conductor 32, and a signal line beginning connected to the output 14 of the output driver 16 of the integrated circuit 18. In contrast to the signal line 312 in FIG. 3 which branches out into two tracks, the signal line 412 in FIG. 4 branches out into a first bundle of track conductors $34_1$, $34_2$, . . . and $34_n$ ($n > 1$, $n \in N$), and into a second bundle of track conductors $36_1$, $36_2$, . . . and $36_n$ ($n > 1$, $n \in N$). The first bundle of track conductors $34_1$-$34_n$ have line ends that are respectively connected to inputs $20_1$, $20_2$, . . . and $20_n$ ($n > 1$, $n \in N$) of input drivers $24_1$, $24_2$, . . . , and $24_n$ ($n > 1$, $n \in N$) of a first group of integrated circuits $28_1$, $28_2$, . . . , and $28_n$ ($n > 1$, $n \in N$) and. The second bundle of track conductors $36_1$-$36_n$ have line ends are respectively connected to inputs $22_1$, $22_2$, . . . and $22_n$ ($n > 1$, $n \in N$) of input drivers $26_1$, $26_2$ . . . , and $26_n$ ($n > 1$, $n \in N$) of a second group of integrated circuits $30_1$, $30_2$, . . . , and $30_n$ ($n > 1$, $n \in N$).

The line ends of track conductors $34_1$-$34_n$ of the first bundle are terminated, according to the termination shown in FIG. 3, using respective terminating resistor $338_1$, $338_2$, . . . , and $338_n$ ($n > 1$, $n \in N$) connected to the supply voltage $U_B$. The line ends of the second bundle of track conductors $36_1$-$36_n$ ($n > 1$, $n \in N$) are terminated, according to the termination in FIG. 3, using respective terminating resistors $346_1$, $346_2$, . . . , and $346_n$ ($n > 1$, $n \in N$) connected to the reference potential GND. The terminating resistors $338_1$-$338_n$ and the terminating resistors $346_1$-$346_n$ each have an impedance value (e.g., 75Ω) which is determined by the line impedance.

Additionally, where a circuit has the T-shaped signal line 412 having 2n (n>1, n∈N) line ends, the termination voltage (e.g., 0.9V) is generated by voltage dividers which are formed, on the one hand, by terminating resistors $338_1$-$338_n$ (n>1, n∈N), each connected to the supply voltage UB and, on the other hand, by terminating resistors $346_1$-$346_n$ (n>1, n∈N), each connected to the reference voltage GND and also by the low-impedance track conductors.

The supply voltage $U_B$ is generated in the same way as according to FIG. 3. For example, in the embodiment in FIG. 4, the power supply unit B and/or an external power source generates the supply voltage $U_B$.

The termination according to the embodiment illustrated in FIG. 4 may be used with any printed circuit board having an integrated circuit which drives two inputs of other integrated circuits over a T-shaped structure of a signal line using an output driver. In a preferred embodiment, the "other" integrated circuits include read-write memories, in particular RAMs, having address, control, and clock inputs.

Although the present invention has been shown and described with respect to several preferred embodiments thereof, various changes, omissions and additions to the form and detail thereof, may be made therein, without departing from the spirit and scope of the invention.

What is claimed is:

1. A printed circuit board having a termination of a T-shaped signal line, comprising:
    a first integrated circuit having at least one data output,
    a second integrated circuit and a third integrated circuit, each having a data input,
    a power supply unit for generating a supply voltage against a reference potential for the second and the third integrated circuits,
    a line beginning of the T-shaped signal line connected to the data output of the first integrated circuit,
    at least two line ends of the T-shaped signal line, a respective one of said at least two line ends connected to the data input of a respective one of the second and the third integrated circuits, and
    a terminating voltage circuit for generating a terminating voltage including a first and second terminating resistors respectively terminating the line ends of the data inputs of the second and the third integrated circuits,
    wherein the first terminating resistor has one end connected to said power supply unit and another end connected to said data input of the second integrated circuit,
    wherein the second terminating resister has one end connected to said reference potential and another end connected to said data input of the third integrated circuit,
    wherein said first and second terminating resistors form a voltage divider for dividing said supply voltage,
    wherein said third integrated circuit is only connected to said first terminating resistor, said second terminating resistor, said first integrated circuit and said second integrated circuit, and
    wherein each of said first and second terminating resistors has a resistance which is determined based on an impedance of a respective one of said at least two line ends of the T-shaped signal line each connected to the data input of the second and the third integrated circuits.

2. The printed circuit board of claim 1, wherein the first terminating resistor and the second terminating resistor have equal impedance values.

3. The printed circuit board of claim 1, wherein said termination voltage is 50% of the supply voltage.

4. The printed circuit board of claim 1, wherein at least one of the second and third integrated circuits includes a memory module.

5. The printed circuit board of claim 4, wherein the memory module includes a read-write memory having an input driver that represents one of an address, a control and a clock input.

6. The printed circuit board according to claim 1, wherein said second integrated circuit is only connected to said first terminating resistor, said second terminating resistor, said first integrated circuit and said third integrated circuit.

7. The printed circuit board according to claim 1, wherein said voltage divider is only formed by said first and second terminating resistors.

8. A printed circuit board having a termination of a T-shaped signal line, comprising:
    a first integrated circuit having at least one data output,
    a second integrated circuit and a third integrated circuit, each having a data input,
    a power supply unit for generating a supply voltage against a reference potential for the second and the third integrated circuits,
    a line beginning of the T-shaped signal line connected to the data output of the first integrated circuit,
    at least two line ends of the T-shaped signal line, each connected to the data input of the second and the third integrated circuits, and
    a terminating voltage circuit for generating a terminating voltage including a first and second terminating resistors respectively terminating the line ends of the data inputs of the second and the third integrated circuits,
    wherein the first terminating resistor has one end connected to said power supply unit and another end connected to said data input of the second integrated circuit,
    wherein the second terminating resister has one end connected to said reference potential and another end connected to said data input of the third integrated circuit,
    wherein said first and second terminating resistors form a voltage divider for dividing said supply voltage,
    wherein said third integrated circuit is only connected to said first terminating resistor, said second terminating resistor, said first integrated circuit and said second integrated circuit, and
    wherein each of said first and second terminating resistors has a resistance which is determined based on an impedance of a respective one of said at least two line ends of the T-shaped signal line each connected to the data input of the second and the third integrated circuits
    wherein the t-shaped signal line further includes 2n (n≧1, n∈N) line ends which are each connected to inputs of additional integrated circuits,
    wherein the further line ends are terminated using 2n terminating resistors, and
    wherein a first terminating resistor of each of said 2n resistors terminate against the supply voltage and a second terminating resistor of each of said 2n resistors is terminated against the reference potential.

9. A printed circuit board having a T-shaped signal line termination, comprising;
    a first integrated circuit having a data output;
    second and third integrated circuits, each having a data input;
    a T-shaped signal line having first and second line ends, and that connects, in parallel, the data inputs of the second and the third integrated circuits to the data output of the first integrated circuit;

a power supply unit for generating a supply voltage against a reference potential;

a terminating voltage circuit for generating a terminating voltage including a first and second terminating resistors respectively terminating the line ends of the data inputs of the second and the third integrated circuits, wherein the first terminating resistor has one end connected to said power supply unit and another end connected to said data input of the second integrated circuit, wherein the second terminating resister has one end connected to said power supply unit reference potential and another end connected to said data input of the third integrated circuit, wherein said first and second terminating resistors form a voltage divider for dividing said supply voltage, wherein said third integrated circuit is only connected to said first terminating resistor, said second terminating resistor, said first integrated circuit and said second integrated circuit, and wherein each of said first and second terminating resistors has a resistance which is based on an impedance of a respective one of said at least two line ends of the T-shaped signal line each connected to the data input of the second and the third integrated circuits.

10. A printed circuit board having a T-shaped signal line termination, comprising:

a first integrated circuit having a data output;

second and third integrated circuits, each having a data input;

a T-shaped signal line having first and second line ends, and that connects, in parallel, the data inputs of the second and the third integrated circuits to the data output of the first integrated circuit;

a power supply unit for generating a supply voltage against a reference potential;

a terminating voltage circuit for generating a terminating voltage including a first and second terminating resistors respectively terminating the line ends of the data inputs of the second and the third integrated circuits, wherein the first terminating resistor has one end connected to said power supply unit and another end connected to said data input of the second integrated circuit, wherein the second terminating resister has one end connected to said power supply unit reference potential and another end connected to said data input of the third integrated circuit, wherein said first and second terminating resistors form a voltage divider for dividing said supply voltage, wherein said third integrated circuit is only connected to said first terminating resistor, said second terminating resistor, said first integrated circuit and said second integrated circuit, and wherein each of said first and second terminating resistors has a resistance which is based on an impedance of a respective one of said at least two line ends of the T-shaped signal line each connected to the data input of the second and the third integrated circuits, the printed circuit board further comprising:

fourth and fifth integrated circuits, each having a data input, wherein the T-shaped signal line connects, in parallel, the data inputs of the fourth and fifth integrated circuits to the data output of the first integrated circuit;

a third terminating resistor terminating a third line end of the T-shaped signal line against the supply voltage at the data input of the fourth integrated circuit; and a fourth terminating resistor terminating a fourth line end of the T-shaped signal line against the reference potential at the data input of the fifth integrated circuit.

* * * * *